United States Patent
Lee

(10) Patent No.: US 10,256,215 B2
(45) Date of Patent: Apr. 9, 2019

(54) SEMICONDUCTOR PACKAGE

(71) Applicant: Samsung Electronics Co., Ltd., Suwon-si (KR)

(72) Inventor: Kunsil Lee, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 15/927,373

(22) Filed: Mar. 21, 2018

(65) Prior Publication Data

US 2018/0211937 A1 Jul. 26, 2018

Related U.S. Application Data

(63) Continuation of application No. 15/475,650, filed on Mar. 31, 2017, now Pat. No. 9,941,252.

(30) Foreign Application Priority Data

Jun. 14, 2016 (KR) .................. 10-2016-0073830

(51) Int. Cl.
*H01L 23/02* (2006.01)
*H01L 23/22* (2006.01)
(Continued)

(52) U.S. Cl.
CPC ........ *H01L 25/0657* (2013.01); *H01L 23/481* (2013.01); *H01L 25/50* (2013.01);
(Continued)

(58) Field of Classification Search
CPC . H01L 2225/06541; H01L 2225/06555; H01L 2225/06513; H01L 21/486; H01L 21/50; H01L 21/60022; H01L 21/77; H01L 24/82; H01L 23/481; H01L 23/49827; H01L 23/49822; H01L 23/5226; H01L 23/528; H01L 23/5283; H01L 23/535; H01L 23/538; H01L 23/5383; H01L 23/5384
(Continued)

(56) References Cited

U.S. PATENT DOCUMENTS 6,642,137 B2 11/2003 Yeh et al.
7,638,362 B2 12/2009 Ishino et al.
(Continued)

FOREIGN PATENT DOCUMENTS

| JP | 2014203868 | 10/2014 |
|---|---|---|
| JP | 2015225933 | 12/2015 |
| KR | 20110000138 | 1/2011 |

OTHER PUBLICATIONS

"Semiconductor Package" Specification, Drawings, and Prosecution History pf U.S. Appl. No. 15/475,650, filed Mar. 31, 2017, by Kun-Sil Lee.

*Primary Examiner* — Hsien Ming Lee
(74) *Attorney, Agent, or Firm* — Onello & Mello, LLP

(57) ABSTRACT

A semiconductor package includes a first semiconductor chip including a through silicon via in the first semiconductor chip and a first trench portion in an upper portion of the first semiconductor chip, a second semiconductor chip on an upper surface of the first semiconductor chip and being electrically connected to the first semiconductor chip through the through silicon via of the first semiconductor chip, and an insulating bonding layer between the first semiconductor chip and the second semiconductor chip. The insulating bonding layer fills the first trench portion.

20 Claims, 19 Drawing Sheets

(51) Int. Cl.
*H01L 25/065* (2006.01)
*H01L 23/48* (2006.01)
*H01L 25/00* (2006.01)

(52) U.S. Cl.
CPC ............... *H01L 2224/16145* (2013.01); *H01L 2224/73204* (2013.01); *H01L 2225/06513* (2013.01); *H01L 2225/06541* (2013.01); *H01L 2225/06555* (2013.01); *H01L 2225/06582* (2013.01); *H01L 2225/06589* (2013.01); *H01L 2225/06593* (2013.01)

(58) Field of Classification Search
USPC ........ 438/107, 109, 127; 257/686, 687, 698, 257/774, 777
See application file for complete search history.

(56) References Cited

U.S. PATENT DOCUMENTS

| | | |
|---|---|---|
| 8,536,718 B2 | 9/2013 | Ko et al. |
| 8,623,704 B2 | 1/2014 | Lee et al. |
| 8,803,332 B2 | 8/2014 | Lee et al. |
| 8,883,566 B2 | 11/2014 | Morifuji et al. |
| 2013/0026655 A1 | 1/2013 | Lee et al. |
| 2013/0344655 A1 | 12/2013 | Ohba |
| 2016/0013174 A1 | 1/2016 | Han et al. |
| 2016/0056086 A1 | 2/2016 | Lee et al. |

SEMICONDUCTOR PACKAGE

CROSS-REFERENCE TO RELATED APPLICATION

This application is a continuation application of U.S. Ser. No. 15/475,650, filed on Mar. 31, 2017 which claims priority under 35 U.S.C. § 119 from Korean Patent Application No. 10-2016-0073830, filed on Jun. 14, 2016, in the Korean Intellectual Property Office, the disclosure of which is hereby incorporated by reference in its entirety.

BACKGROUND

The inventive concepts relate to a semiconductor package, and more particularly, to a semiconductor package including a through silicon via (TSV).

Due to the rapid development of the electronics industry and the demand of users, electronic devices have decreased in size and weight, and, thus, semiconductor devices included in the electronic devices must, likewise, decrease in size and weight and have high performance and large capacity. In order to satisfy such requirements, research and development of semiconductor chips having a TSV structure and a semiconductor package in which the semiconductor chips are stacked has been conducted.

SUMMARY

The inventive concepts provide a semiconductor package having a small size, light weight, high performance, and large capacity and a method of manufacturing the semiconductor package.

In one aspect, the present inventive concepts are directed to a semiconductor package including: a first semiconductor chip including a through silicon via in the first semiconductor chip and a first trench portion in an upper portion of the first semiconductor chip; a second semiconductor chip on an upper surface of the first semiconductor chip and being electrically connected to the first semiconductor chip through the through silicon via of the first semiconductor chip; and an insulating bonding layer between the first semiconductor chip and the second semiconductor chip. The insulating bonding layer fills the first trench portion.

In another aspect, the present inventive concepts are directed to a semiconductor package including: a package substrate; at least two semiconductor chips on an upper surface of the package substrate, stacked in a direction perpendicular to the upper surface of the package substrate, and a through silicon via in the at least two semiconductor chips; and insulating bonding layers respectively between the at least two semiconductor chips, wherein at least one of the at least two semiconductor chips includes a trench portion to be filled with the insulating bonding layers.

In another aspect, the present inventive concepts are directed to a semiconductor package including a first semiconductor chip including a through silicon via extending through a portion of the first semiconductor chip and a first trench portion in an upper portion of the first semiconductor chip spaced apart from the through silicon via, a second semiconductor chip electrically connected to the first semiconductor chip through the through silicon via of the first semiconductor chip, and an insulating bonding layer between the first semiconductor chip and the second semiconductor chip. The insulating bonding layer fills the first trench portion.

BRIEF DESCRIPTION OF THE DRAWINGS

These and/or other aspects and advantages of the present general inventive concepts will become more apparent and more readily appreciated from the following description of the embodiments, taken in conjunction with the accompanying drawings of which.

DETAILED DESCRIPTION OF THE EMBODIMENTS

Figure 1:
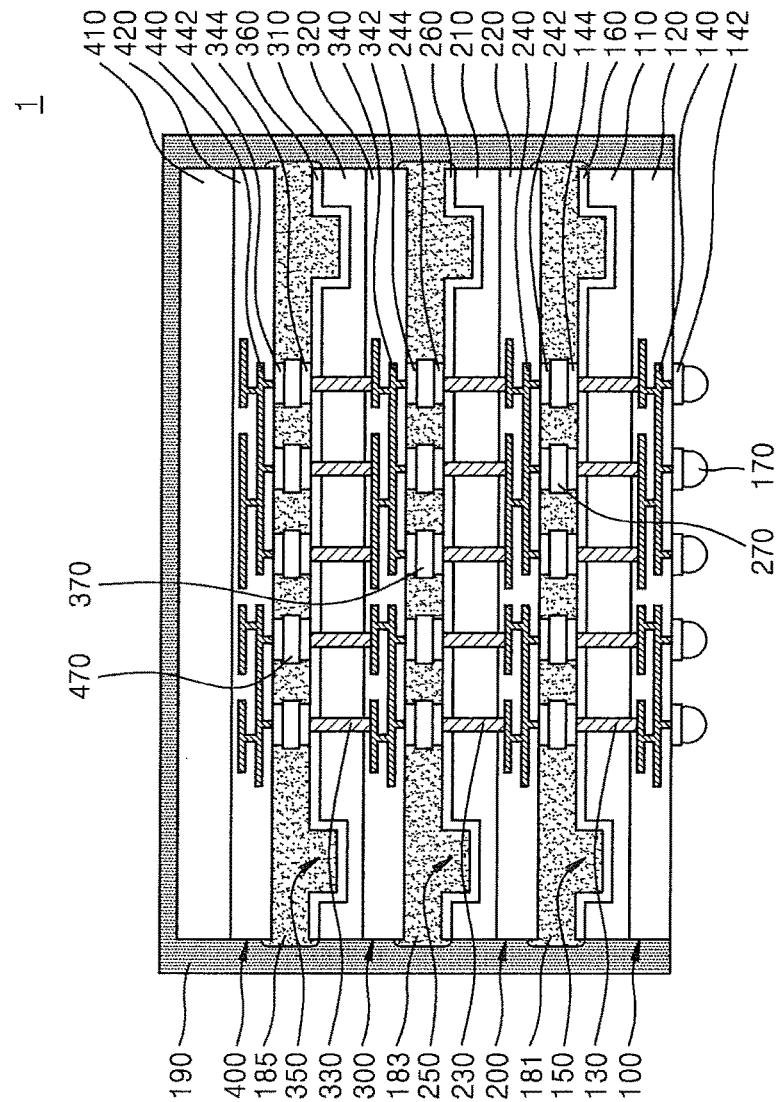
FIG. 1 is a cross-sectional view of a semiconductor package according to some embodiments of the present inventive concepts.

Reference will now be made in detail to the embodiments of the present general inventive concepts, examples of which are illustrated in the accompanying drawings, wherein like reference numerals refer to the like elements throughout. The embodiments are described below in order to explain the present general inventive concepts by referring to the figures.

Figure 2:
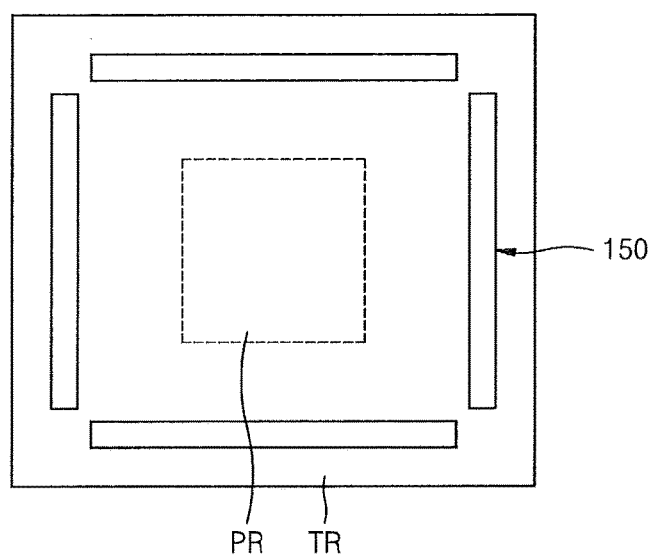
FIG. 2 is a schematic, plan view of an upper surface of a first semiconductor chip of FIG. 1 according to some embodiments of the present inventive concepts.

FIG. 1 is a cross-sectional view of a semiconductor package 1 according to some embodiments of the present inventive concepts. FIG. 2 is a schematic, plan view of an upper surface of a first semiconductor chip 100 of FIG. 1 according to some embodiments of the present inventive concepts.

Referring to FIGS. 1 and 2, the semiconductor package 1 may include the first semiconductor chip 100, a second semiconductor chip 200, a third semiconductor chip 300, and a fourth semiconductor chip 400 which are vertically stacked. The first to fourth semiconductor chips 100 to 400 may be electrically connected to each other or to a package substrate, for example, a package substrate 600 of FIG. 9, through first, second, third, and fourth connection bumps 170, 270, 370, and 470, respectively. That is, the second connection bumps 270 may be formed between the first semiconductor chip 100 and the second semiconductor chip 200, the third connection bumps 370 may be formed between the second semiconductor chip 200 and the third semiconductor chip 300, the fourth connection bumps 470 may be formed between the third semiconductor chip 300 and the fourth semiconductor chip 400. The first connection bumps 170 may be between the first semiconductor chip 100 and, for example, an external device. Also, the first to fourth semiconductor chips 100 to 400 may be bonded to each other through first, second, and third insulating bonding layers 181, 183, and 185. That is, the first insulating bonding layer 181 may be formed between the first semiconductor chip 100 and the second semiconductor chip 200, the second insulating bonding layer 183 may be formed between the second semiconductor chip 200 and the third semiconductor chip 300, the third insulating bonding layer 185 may be formed between the third semiconductor chip 300 and the fourth semiconductor chip 400.

The first to fourth semiconductor chips 100 to 400 may each include a pad region PR. The pad region PR may be a region where first, second, and third through silicon vias 130, 230, and 330, first, second, third, and fourth lower connection pads 142, 242, 342, and 442, and first, second, and third upper connection pads 144, 244, and 344 for electrically connecting the first to fourth semiconductor chips 100 to 400 to each other are formed. The first to fourth lower connection pads 142, 242, 342 and 442 may be formed along lower surfaces of the first to fourth semiconductor chips 100 to 400, respectively. The first to third upper connection pads 144, 244 and 344 may be formed along upper surfaces of the first to third semiconductor chips 100 to 300, respectively.

FIG. 2 illustrates an example of the upper surface of the first semiconductor chip 100, and the first semiconductor chip 100 may include the pad region PR on a central portion of the first semiconductor chip 100 and a trench formation region TR around an edge of the pad region PR, that is, surrounding the pad region PR. First trench portions 150, which will be described below, may be formed in the trench formation region TR. A second trench portion 250 and a third trench portion 350 may be formed in the trench formation regions TR of the second and third semiconductor chips 200 and 300, respectively.

The first to fourth semiconductor chips 100 to 400 may each be, for example, logic chips or memory chips. For example, the first to fourth semiconductor chips 100 to 400 may be of the same type. Alternatively, some of the first to fourth semiconductor chips 100 to 400 may be memory chips, and the others thereof may be logic chips.

The memory chip may be, for example, a volatile memory chip such as a Dynamic Random Access Memory (DRAM) or a Static Random Access Memory (SRAM) or a non-volatile memory chip such as a Phase-change Random Access Memory (PRAM), a Magnetoresistive Random Access Memory (MRAM), a Ferroelectric Random Access Memory (FeRAM), or a Resistive Random Access Memory (RRAM). In some embodiments, the first to fourth semiconductor chips 100 to 400 may be, for example, High Bandwidth Memory (HBM) DRAM semiconductor chips. In addition, the logic chip may be, for example, a micro processor, an analog device, or a digital signal processor.

In the semiconductor package 1 illustrated in FIG. 1, the first to fourth semiconductor chips 100 to 400 are stacked. However, the number of semiconductor chips stacked in the semiconductor package 1 is not limited thereto. For example, 2 to 32 semiconductor chips may be stacked in the semiconductor package 1.

The first semiconductor chip 100 may include a first semiconductor substrate 110, a first semiconductor device layer 120, the first through silicon via 130, the first lower connection pad 142, the first upper connection pad 144, and the first trench portions 150.

The first semiconductor substrate 110 may have upper and lower surfaces which are opposite each other. The first semiconductor substrate 110 may include the first semiconductor device layer 120 formed on the lower surface of the first semiconductor substrate 110. The first trench portions 150 may be formed in upper portions of the first semiconductor substrate 110. The first through silicon via 130 may extend from the upper surface of the first semiconductor substrate 110 toward the lower surface of the first semiconductor substrate 110 by penetrating the first semiconductor substrate 110 and may be connected to one of wire structures 140 included in the first semiconductor device layer 120. The first lower connection pad 142 may be formed along a lower surface of the first semiconductor device layer 120 and may be electrically connected to the first through silicon via 130 through the wire structure 140.

The first semiconductor substrate 110 may include, for example, silicon (Si). Alternatively, the first semiconductor substrate 110 may include, for example, a semiconductor element such as germanium (Ge) or a compound semiconductor such as silicon carbide (SiC), gallium arsenide (GaAs), indium arsenide (InAs), and indium phosphide (InP). Alternatively, the first semiconductor substrate 110 may have, for example, a silicon on insulator (SOI) structure. For example, the first semiconductor substrate 110 may include a buried oxide (BOX) layer. The first semiconductor substrate 110 may include, for example, a conductive region, for example, a well or a structure doped with impurities. Also, the first semiconductor substrate 110 may have various device isolation structures such as a shallow trench isolation (STI) structure.

The first semiconductor device layer 120 may include the wire structures 140 for connecting the aforementioned devices to other wires formed in the first semiconductor substrate 110. The wire structures 140 may include, for example, metal wire layers and via plugs. For example, the wire structure 140 may be a multilayer structure in which at least two metal wire layers or at least two via plugs are alternately stacked.

The first through silicon via 130 may extend from the upper surface of the first semiconductor substrate 110 toward the lower surface of the first semiconductor substrate 110 and may extend partly into the first semiconductor device layer 120. The first through silicon via 130 may extend in a substantially vertical direction of extension relative to a substantially horizontal direction of extension of the first semiconductor substrate 110. At least a portion of the first through silicon via 130 may have a pillar form.

The first lower connection pad 142 may be on the first semiconductor device layer 120 and may be electrically connected to the wire structures 140 within the first semiconductor device layer 120. The first lower connection pad 142 may be electrically connected to the first through silicon via 130 through the wire structures 140. The first lower connection pad 142 may include, for example, at least one of aluminum (Al), copper (Cu), nickel (Ni), tungsten (W), platinum (Pt), and gold (Au).

Although not shown in FIG. 1, a passivation layer may be formed on the first semiconductor device layer 120 in order to protect the wire structures 140 within the first semiconductor device layer 120 and other structures thereunder from external impact or moisture. That is, the passivation layer may be formed along a lower surface of the first semiconductor device layer 120. The passivation layer may expose at least a portion of an upper surface of the first lower connection pad 142.

The first upper connection pad 144, electrically connected to the first through silicon via 130, may be formed on the upper surface of the first semiconductor substrate 110. The first upper connection pad 144 may include, for example, at least one of Al, Cu, Ni, W, Pt, and Au. Also, a first rear-surface protection layer 160 may be formed over the upper surface of the first semiconductor substrate 110 and surround portions of side surfaces of the first through silicon vias 130. That is the first through silicon vias 130 may extend through the first rear-surface protection layer 160 and the first semiconductor substrate 110.

First connection bumps 170 may be arranged on the first lower connection pad 142. The first connection bumps 170 may electrically connect the semiconductor package 1 to an external package substrate, for example, a package substrate 600 of FIG. 9. The first connection bump 170 may receive, from the outside, for example, at least one of a control signal, a power signal, and a ground signal for operations of the first to fourth semiconductor chips 100 to 400, receive data signals to be stored in the first to fourth semiconductor chips 100 to 400 from the outside, or provide data stored in the first to fourth semiconductor chips 100 to 400 to the outside. For example, the first connection bump 170 may have a pillar structure and may include a solder layer.

The first trench portions 150 may be in upper portions of the first semiconductor chip 100 within the trench formation region TR. A first insulating bonding layer 181 may fill a space provided by the first trench portions 150 and fill a space between the first semiconductor chip 100 and the second semiconductor chip 200. A surface of the first trench portions 150 may be covered by the first rear-surface protection layer 160. The first insulating bonding layer 181 may be formed along an upper surface of the first rear-surface protection layer 160.

The second semiconductor chip 200 may be mounted above the upper surface of the first semiconductor chip 100. The second semiconductor chip 200 may be electrically connected to the first semiconductor chip 100 through the second connection bumps 270, the first upper connection pads 144 and the second lower connection pads 242 between the first semiconductor chip 100 and the second semiconductor chip 200.

Also, the first insulating bonding layer 181 is between the upper surface of the first semiconductor chip 100 and a lower surface of the second semiconductor chip 200 surrounding the first upper connection pads 144, the second connection bumps 270 and the second lower connection pads 242 and filing the first trench portions 150. Thus, the second semiconductor chip 200 may be attached to the first semiconductor chip 100. As shown in FIG. 1, the first insulating bonding layer 181 may protrude between the first and second semiconductor chips 100 and 200 from side surfaces of the first semiconductor chip 100 and the second semiconductor chip 200, and protruding portions of the first insulating bonding layer 181 may cover part of the side surfaces of the first semiconductor chip 100 and the second semiconductor chip 200. Also, portions of the first insulating bonding layer 181 may fill the first trench portions 150, the first trench portions 150 being in the upper portions of the first semiconductor chip 100.

The third semiconductor chip 300 may be mounted above an upper surface of the second semiconductor chip 200, and the fourth semiconductor chip 400 may be mounted above an upper surface of the third semiconductor chip 300. Third connection bumps 370, the second upper connection pads 244, the third lower connection pads 342 and a second insulating bonding layer 183 surrounding side surfaces of the third connection bumps 370, the second upper connection pads 244 and the third lower connection pads 342 may be between the second semiconductor chip 200 and the third semiconductor chip 300. Fourth connection bumps 470, the third upper connection pads 344, the fourth lower connection pads 442 and a third insulating bonding layer 185 surrounding side surfaces of the fourth connection bumps 470, the third upper connection pads 344 and the fourth lower connection pads 442 may be between the third semiconductor chip 300 and the fourth semiconductor chip 400.

The second semiconductor chip 200 may include a second semiconductor substrate 210, a second semiconductor device layer 220 having wire structures 240, the second through silicon vias 230, the second lower connection pads 242, the second upper connection pads 244, a second rear-surface protection layer 260, and second trench portions 250 as described above in connection with the first semiconductor chip 100. The third semiconductor chip 300 may include a third semiconductor substrate 310, a third semiconductor device layer 320 having wire structures 340, the third through silicon vias 330, the third lower connection pads 342, the third upper connection pads 344, a third rear-surface protection layer 360, and third trench portions 350 as described above in connection with the first semiconductor chip 100. The fourth semiconductor chip 400 may include a fourth semiconductor substrate 410, a fourth semiconductor device layer 420 having wire structures 440, and the fourth connection pads 442 as described above in connection with the first semiconductor chip 100. The fourth semiconductor chip 400 may not include a trench portion, unlike the first to third semiconductor chips 100 to 300. The second to fourth semiconductor chips 200 to 400 may have similar technical features to the first semiconductor chip 100, and, thus, detailed descriptions of the second to fourth semiconductor chips 200 to 400 are omitted.

In some embodiments, the first, second, and third insulating bonding layers 181, 183, and 185 may include, for example, non conductive films (NCFs) or non conductive pastes (NCPs). Alternatively, the first, second, and third insulating bonding layers 181, 183, and 185 may include, for example, underfill materials such as insulating polymers or epoxy resin.

A first molding layer 190 may surround the side surfaces of the first to fourth semiconductor chips 100 to 400 and side surfaces of the first, second, and third insulating bonding layers 181, 183, and 185. In some embodiments, the first molding layer 190 may cover an upper surface of the fourth semiconductor chip 400. In some embodiments, the first molding layer 190 may expose the upper surface of the fourth semiconductor chip 400 to the outside. The first molding layer 190 may include, for example, an epoxy mold compound (EMC), or the like.

In some embodiments, the first, second, and third trench portions 150, 250, and 350 may provide spaces in which the first, second, and third insulating bonding layers 181, 183, and 185 fill between the first to fourth semiconductor chips 100 to 400, respectively, and, thus, may prevent excessive overflow of the first, second, and third insulating bonding layers 181, 183, and 185.

The first, second, and third trench portions 150, 250, and 350 may have structures that are sufficient to reduce or remove the overflow of the first, second, and third insulating bonding layers 181, 183, and 185. For example, overflow volumes and/or shapes of the first, second, and third insulating bonding layers 181, 183, and 185 that overflow may be considered to determine the structures of the first, second, and third trench portions 150, 250, and 350.

In some embodiments, the first, second, and third trench portions 150, 250, and 350 may extend along at least some portions of edges of the first to third semiconductor chips 100 to 300. For example, as shown in FIG. 2, the first trench portions 150 may be spaced apart from the edge of the first semiconductor chip 100, may extend along at least a portion of the edge of the first semiconductor chip 100, and may have a linear shape. In such an embodiment, the first trench portions 150 may be arranged on regions except regions close to corners of the first semiconductor chip 100. That is, as illustrated in FIG. 2, the first semiconductor chip 100 may include trench portions 150 along each edge of the first semiconductor chip 100 which are spaced apart from each other at the corners of the first semiconductor chip 100.

In general, when the first insulating bonding layer 181 between the first semiconductor chip 100 and the second semiconductor chip 200 overflows, an overflow amount of the first insulating bonding layer 181 decreases as the first insulating bonding layer 181 is positioned close to the corners of the first semiconductor chip 100. On the contrary, as the first insulating bonding layer 181 is positioned close to a central portion of the edge of the first semiconductor chip 100, the overflow amount of the first insulating bonding layer 181 may increase. Therefore, as shown in FIG. 2, the first trench portions 150 are arranged to extend along the edge of the first semiconductor chip 100 except for along the regions close to the corners of the first semiconductor chip 100 such that the first insulating bonding layer 181 may be prevented from excessively overflowing in a region close to the central portion of the edge of the first semiconductor chip 100. In addition, the regions close to the corners of the first semiconductor chip 100 are fully filled at the same time.

The first trench portions 150 above the first semiconductor chip 100 have been described with reference to FIG. 2, but the second and third trench portions 250 and 350 above the second and third semiconductor chips 200 and 300, respectively, may have substantially the same structure as the first trench portions 150.

Figure 3:
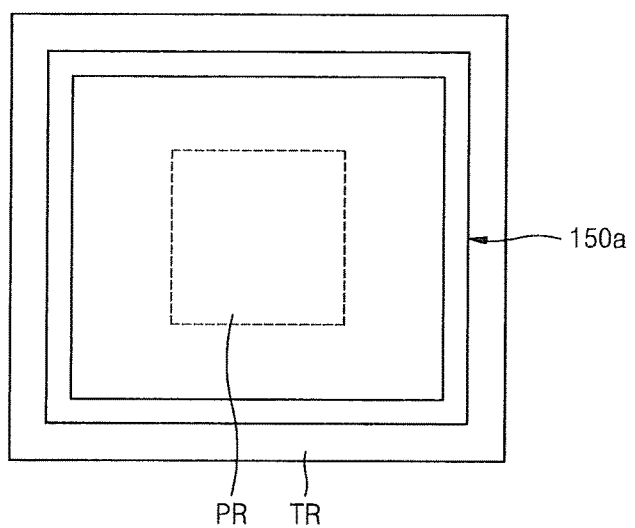
FIGS. 3 to 5 are schematic, plan views of the upper surface of the first semiconductor chip of FIG. 1 illustrating structures of first trench portions, according to some embodiments of the present inventive concepts.
Figure 4:
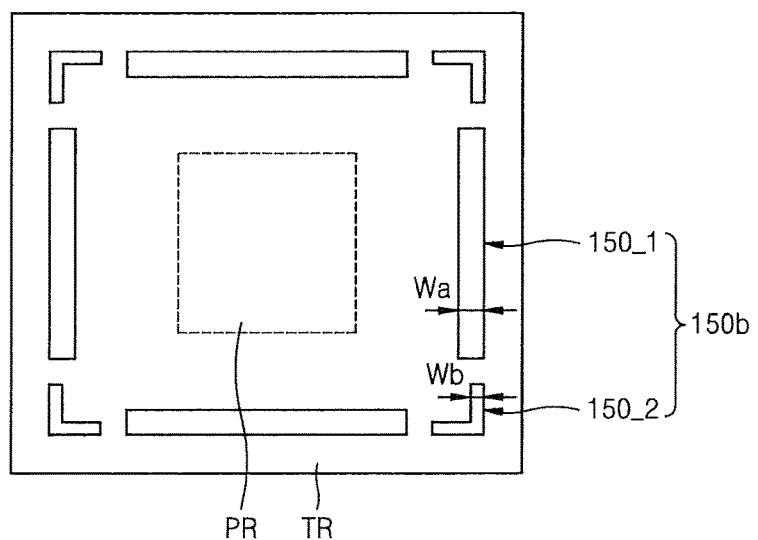
Figure 5:
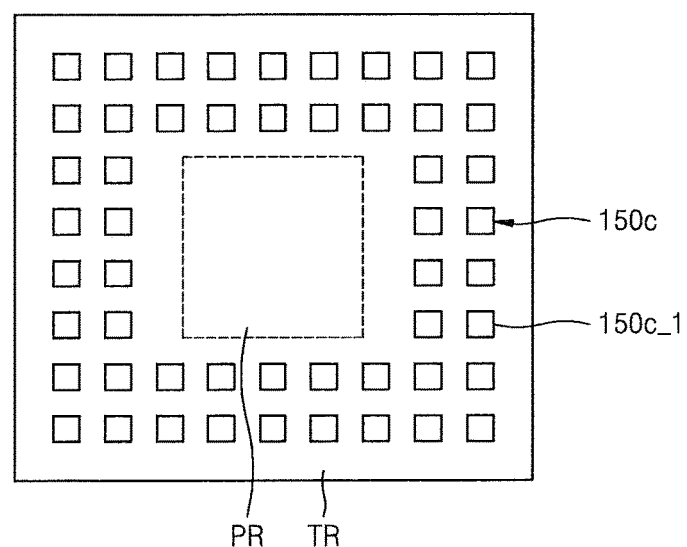

FIGS. 3 to 5 are schematic, plan views of the upper surface of the first semiconductor chip 100 illustrate structures of first trench portions 150a to 150c, respectively, according to some embodiments of the present inventive concepts.

Referring to FIG. 3, the first trench portion 150a may have a ring shape that is spaced apart from the edge of the first semiconductor chip 100 and extends along the edge of the first semiconductor chip 100. FIG. 3 illustrates that the first trench portion 150a has a rectangular shape, but the first trench portion 150a may have various shapes such as a circle, an oval, a rectangle having rounded corners, or the like. Also, FIG. 3 illustrates that the first trench portion 150a having the ring shape has a uniform width. However, the width of the first trench portion 150a having the ring shape may be variously adjusted by taking into account a volume and/or a shape of an insulating bonding layer that overflows.

Referring to FIG. 4, the first trench portion 150b may include a trench portion 150_1 having a linear shape and extending along a portion of the edge of the first semiconductor chip 100 and a trench portion 150_2 that is bent around the corner of the first semiconductor chip 100. The trench portion 150_1 may be a line-shaped trench portion. The trench portion 150_1 having the linear shape and the trench portion 150_2 that is bent around the corner may be spaced apart from each other by a certain distance. Also, the trench portion 150_1 having the linear shape and the trench portion 150_2 that is bent around the corner may have a first width Wa and a second width Wb, respectively. The first width Wa may be greater than the second width Wb. FIG. 4 illustrates that the trench portion 150_2 is bent around the corner at a right angle. However, the inventive concepts are not limited thereto, and the trench portion 150_2 may be bent at various angles according to necessity. However, in some embodiments, the trench portion 150_1 having the linear shape and the trench portion 150_2 that is bent around the corner may be connected to each other.

Referring to FIG. 5, the first trench portions 150c may be evenly distributed along the first semiconductor chip 100 except for in the pad region PR. That is, the first trench portions 150c may be spaced apart from one another around the pad region PR.

For example, the first trench portions 150c may be arranged in a matrix form and may include unit trench portions 150c_1 that are spaced apart from one another. The unit trench portions 150c_1 are illustrated as squares; however, the unit trench portions 150c_1 may have various shapes. Also, as shown in FIG. 5, the unit trench portions 150c_1 may all have the same shape. However, the unit trench portions 150c_1 may have different shapes.

The first trench portions 150a to 150c of the first semiconductor chip 100 have been described with reference to FIGS. 3 to 5. However, the second and third trench portions 250 and 350 of the second and third semiconductor chips 200 and 300, respectively, of FIG. 1 may have substantially the same structure as the first trench portions 150a to 150c.

Figure 6:
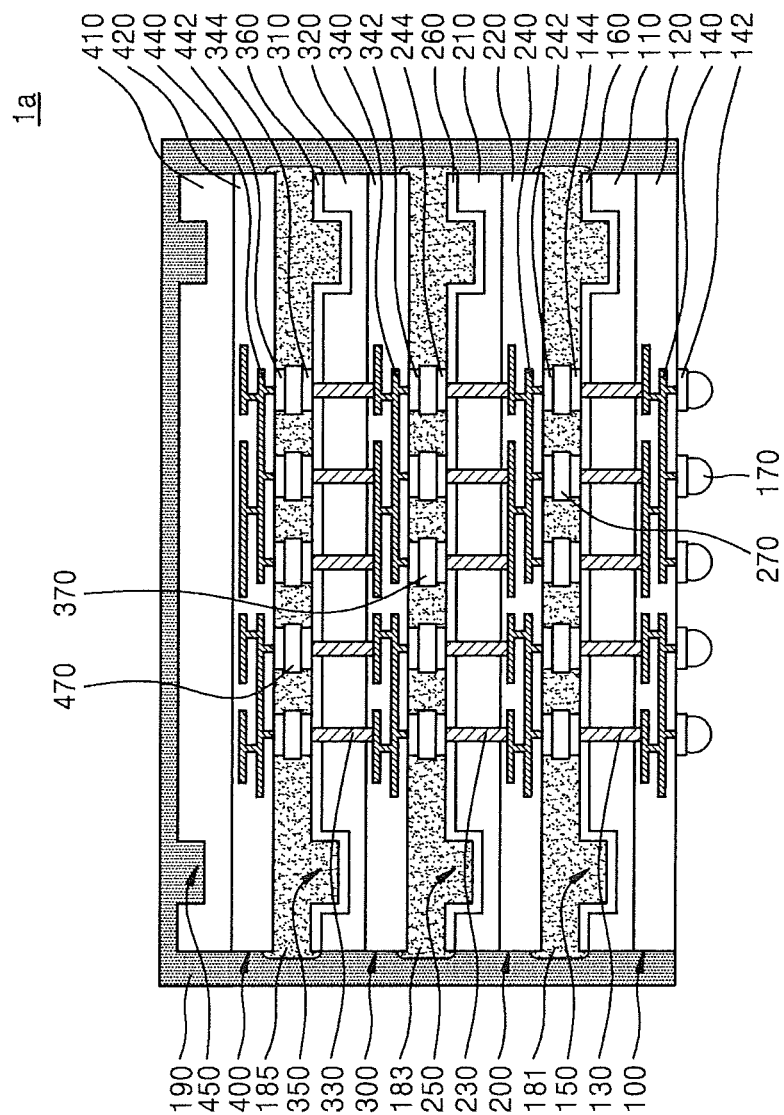
FIG. 6 is a cross-sectional view of a semiconductor package according to some embodiments of the present inventive concepts.

FIG. 6 is a cross-sectional view of a semiconductor package 1a according to some embodiments of the present inventive concepts.

The semiconductor package 1a of FIG. 6 is substantially the same as the semiconductor package 1 of FIG. 1, except that the fourth semiconductor chip 400, which is an uppermost layer of the semiconductor package 1a, further includes fourth trench portions 450. Like reference numerals in FIGS. 1 and 6 denote like elements, and detailed descriptions thereof are simplified or omitted.

Referring to FIG. 6, the semiconductor package 1 a may include the first to fourth semiconductor chips 100 to 400 that are stacked in a substantially vertical direction. That is, the first to fourth semiconductor chips 100 to 400 are stacked in a substantially vertical direction relative to a substantially horizontal direction of extension of the first to fourth semiconductor chips 100 to 400. The fourth semiconductor chip 400 that is the uppermost layer among the first to fourth semiconductor chips 100 to 400 may include the fourth trench portions 450 in upper portions of the fourth semiconductor chip 400. The fourth trench portions 450 increase a surface area of the upper surface of the fourth semiconductor chip 400 such that heat dissipating characteristics of the semiconductor package 1a may be improved.

In some embodiments, the fourth trench portions 450 may have substantially the same structure as the first trench portions 150 and 150a to 150c of the first semiconductor chip 100, which are described in connection with FIGS. 1 to 5.

In some embodiments, the fourth semiconductor chip 400 may not have a through silicon via or an upper connection pad, and, in such an embodiment, the fourth trench portions 450 may be arranged within a pad region PR of the semiconductor package 1a, unlike the first, second, and third trench portions 150, 250, and 350. The first molding layer 190 may be formed along the upper surface of the fourth semiconductor chip 400 filling the fourth trench portions 450.

Figure 7:
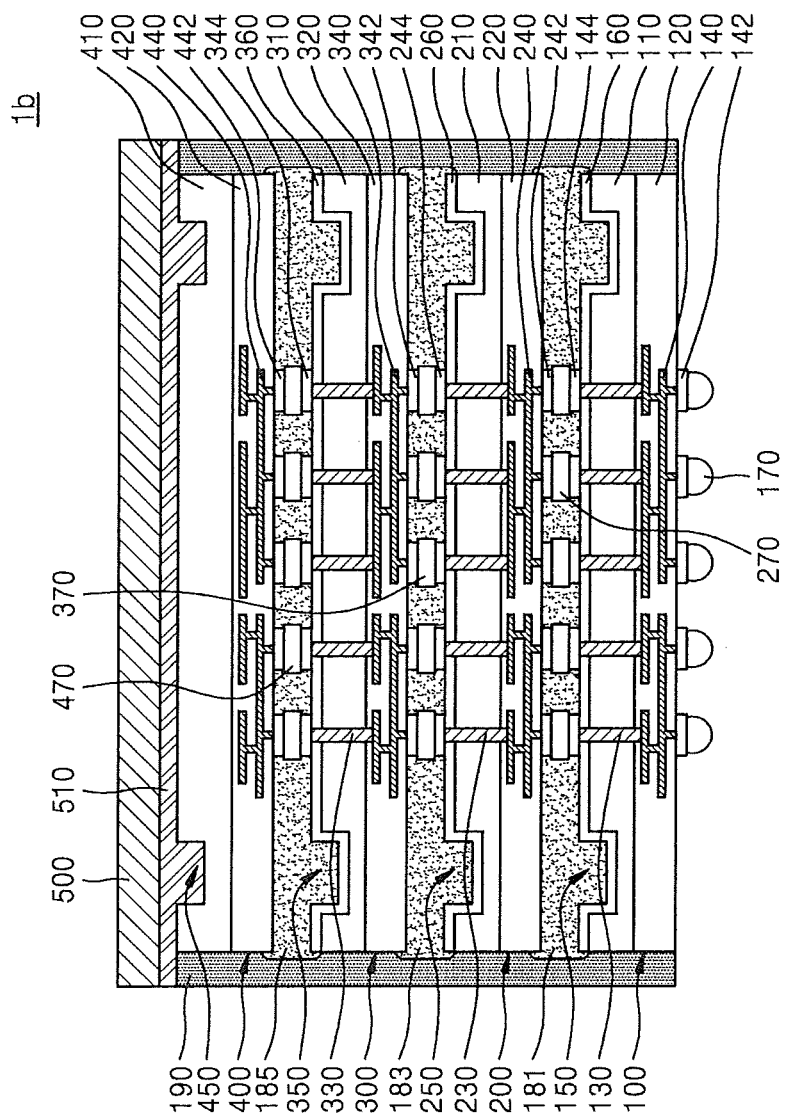
FIG. 7 is a cross-sectional view of a semiconductor package according to some embodiments of the present inventive concepts.

FIG. 7 is a cross-sectional view of a semiconductor package 1b according to some embodiments of the present inventive concepts.

The semiconductor package 1b of FIG. 7 is substantially the same as the semiconductor package 1a of FIG. 6, except that the semiconductor package 1b further includes a thermal interface material layer 510 and a heat dissipator 500 which are sequentially stacked on the fourth semiconductor chip 400 and an upper surface of the first molding layer 190. Like reference numerals in FIGS. 6 and 7 denote like elements, and detailed descriptions thereof are simplified or omitted.

Referring to FIG. 7, the semiconductor package 1b may include the first to fourth semiconductor chips 100 to 400, the thermal interface material layer 510, and the heat dissipator 500 which are vertically stacked in a vertical direction. That is, the first to fourth semiconductor chips 100 to 400, the thermal interface material layer 510, and the heat dissipator 500 are stacked in a substantially vertical direction relative to a substantially horizontal direction of extension of the first to fourth semiconductor chips 100 to 400.

The thermal interface material layer 510 may be between heat dissipator 500 and the fourth semiconductor chip 400 and may fill the fourth trench portions 450. The thermal interface material layer 510 may help heat generated in the first to fourth semiconductor chips 100 to 400 be smoothly discharged to the heat dissipator 500. The thermal interface material layer 510 may include, for example, a thermal interface material (TIM). For example, the thermal interface material layer 510 may include an insulating material or a material including an insulating material and, thus, maintaining electrical insulation. The thermal interface material layer 510 may include, for example, epoxy resin. The thermal interface material layer 510 may include, for example, mineral oil, grease, gap filler putty, phase change gel, phase change material pads, particle filled epoxy, or the like.

The heat dissipator 500 may be on the thermal interface material layer 510. The heat dissipator 500 may be, for example, a heat sink, a heat spreader, a heat pipe, a liquid cooled plate, or the like.

The fourth trench portions 450 in upper portions of the fourth semiconductor chip 400 may increase an area of a region where the fourth semiconductor chip 400 contacts the thermal interface material layer 510. Thus, the heat generated in the first to fourth semiconductor chips 100 to 400 may be effectively transmitted to the heat dissipator 500.

Figure 8:
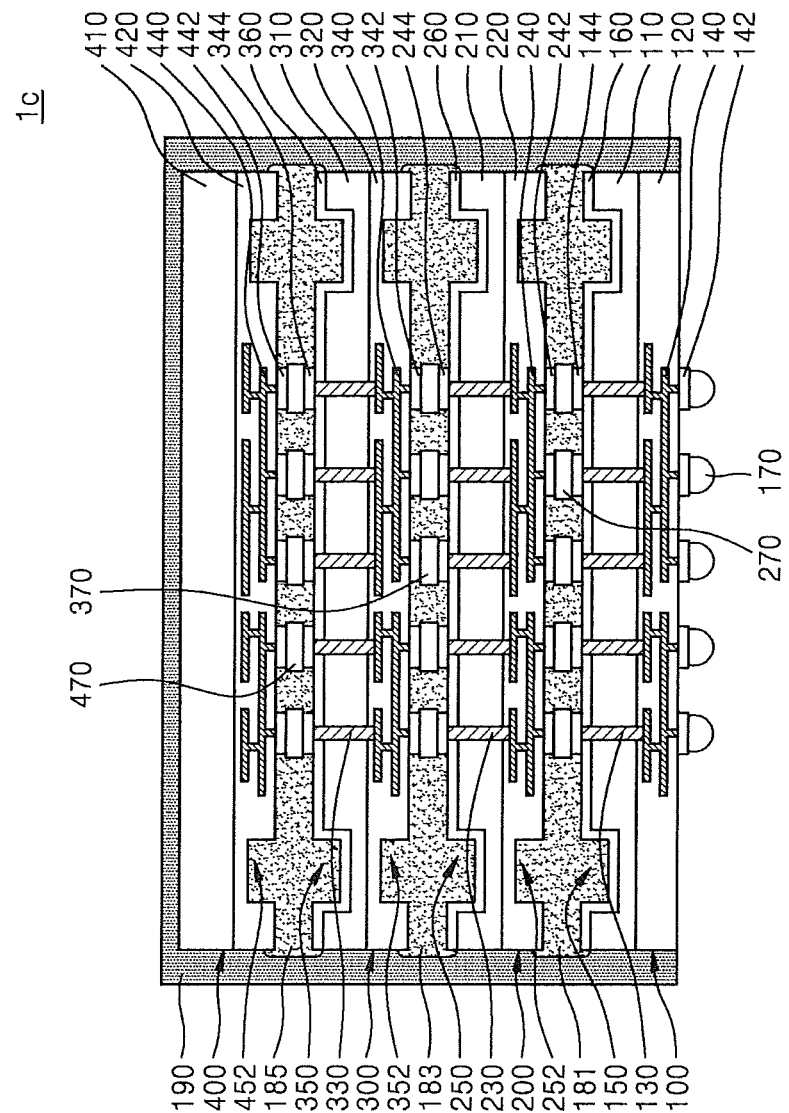
FIG. 8 is a cross-sectional view of a semiconductor package according to some embodiments of the present inventive concepts.

FIG. 8 is a cross-sectional view of a semiconductor package 1c according to some embodiments of the present inventive concepts.

The semiconductor package 1c of FIG. 8 is substantially the same as the semiconductor package 1 of FIG. 1, except that at least some of the first to fourth semiconductor chips 100 to 400 further include trench portions thereunder. For example, as illustrated in FIG. 8, the second to fourth semiconductor chips 200 to 400 include first, second, and third lower trench portions 252, 352, and 452, respectively, thereunder. Like reference numerals in FIGS. 1 and 8 denote like elements, and detailed descriptions thereof are simplified or omitted.

Referring to FIG. 8, the semiconductor package 1c may include the first to fourth semiconductor chips 100 to 400 stacked in a vertical direction. That is, the first to fourth semiconductor chips 100 to 400 are stacked in a substantially vertical direction relative to a substantially horizontal direction of extension of the first to fourth semiconductor chips 100 to 400. The first to third semiconductor chips 100 to 300 may respectively include the first, second, and third trench portions 150, 250, and 350 in the upper portions of the first to third semiconductor chips 100 to 300, respectively, which contact the first, second, and third insulating bonding layers 181, 183, and 185. Also, the second to fourth semiconductor chips 200 to 400 may include the first, second, and third lower trench portions 252, 352, and 452 in the lower portions of the second to fourth semiconductor chips 200 to 400, respectively, which contact the first, second, and third insulating bonding layers 181, 183, and 185. The first, second and third insulating bonding layers 181, 183 and 185 fill the first, second and third lower trench portions 252, 352 and 452, respectively.

The first lower trench portions 252 may be arranged in a trench formation region of the second semiconductor chip 200 which surrounds an edge of a pad region of the second semiconductor chip 200 and may be in the lower portion of the second semiconductor chip 200. The first insulating bonding layer 181 may fill a space provided by the first lower trench 252 and fill a space between the first semiconductor chip 100 and the second semiconductor chip 200. The first lower trench portions 252 and the first trench portions 150 may prevent the first insulating bonding layer 181 from overflowing. Although not shown in FIG. 8, a passivation layer may be formed on the lower surface of the second semiconductor chip 200 and may cover upper surfaces of the first lower trench portions 252. The second and third lower trench portions 352 and 452 may be substantially the same as the first lower trench portions 252, and, thus, detailed descriptions thereof are omitted.

Figure 9:
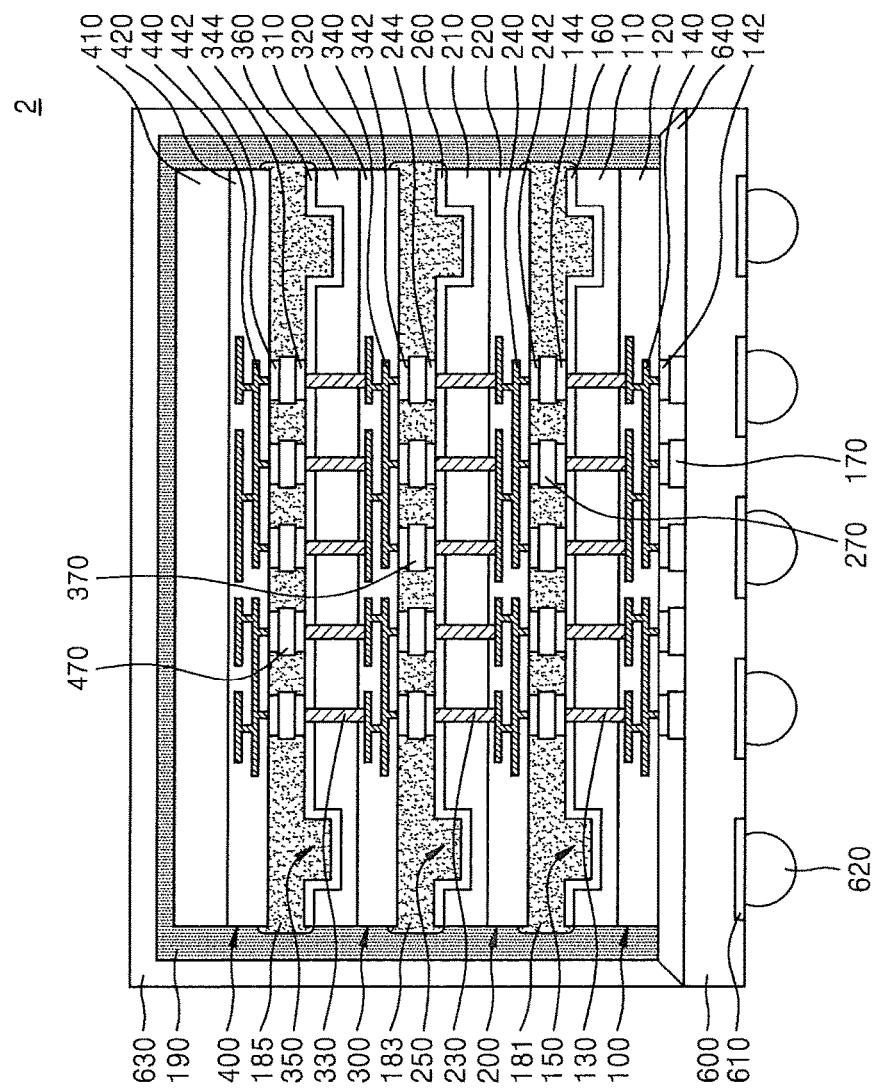
FIG. 9 is a cross-sectional view of a semiconductor package according to some embodiments of the present inventive concepts.

FIG. 9 is a cross-sectional view of a semiconductor package 2 according to some embodiments of the present inventive concepts.

The semiconductor package 2 of FIG. 9 is substantially the same as the semiconductor package 1 of FIG. 1, except that the semiconductor package 2 further includes a package substrate 600. Like reference numerals in FIGS. 1 and 9 denote like elements, and detailed descriptions thereof are simplified or omitted.

Referring to FIG. 9, the semiconductor package 2 may include the package substrate 600 and the first to fourth semiconductor chips 100 to 400 that are mounted on the package substrate 600 and sequentially stacked in a direction perpendicular to an upper surface of the package substrate 600, that is, in a substantially vertical direction of extension relative to a substantially horizontal direction of extension of the package substrate 600.

The package substrate 600 may be, for example, a printed circuit board (PCB), a ceramic substrate, an interposer or the like. When the package substrate 600 is a PCB, the package substrate 600 may include a substrate base, an upper pad (not shown), a lower pad 610, and solder resist layers (not shown) on upper and lower surfaces of the substrate base. Wires that electrically connect the upper pad and the lower pad 610 to each other may be formed in the substrate base. The upper pad and the lower pad 610 may be portions of circuit wires that are not covered by the solder resist layers. The circuit wires may be formed, for example, by coating Cu foil on the upper and lower surfaces of the substrate base and then patterning the Cu foil.

When the package substrate 600 is an interposer, the package substrate 600 may include a substrate base including a semiconductor material and the upper pad (not shown) and the lower pad 610, respectively, formed on the upper and lower surfaces of the substrate base. The substrate base may include, for example, a silicon wafer. Also, wires may be formed on the upper and lower surfaces of the substrate base or may be formed in the substrate base. Also, through vias (not shown) that electrically connect the upper pad and the lower pad 610 to each other may be formed in the substrate base, for example.

External connection terminals 620 may be attached to a lower surface of the package substrate 600. The external connection terminals 620 may be attached to, for example, the lower pad 610. The external connection terminals 620 may be, for example, solder balls, bumps or the like. The external connection terminals 620 may electrically connect the semiconductor package 2 to an external device.

A second molding layer 630 that covers part or an entire portion of the first to fourth semiconductor chips 100 to 400 may be formed on the package substrate 600. The second molding layer 630 may surround the first molding layer 190 and may not directly contact the side surfaces of the first to fourth semiconductor chips 100 to 400. The second molding layer 630 may extend along an outer sidewall of the first molding layer 190. The second molding layer 630 may include, for example, an EMC.

An underfill material layer 640 may be formed between the package substrate 600 and the first semiconductor chip 100. The underfill material layer 640 may be between the package substrate 600 and the first semiconductor chip 100 and may surround side surfaces of the first connection bump 170 and the lower first connection pads 142. The underfill material layer 640 may include, for example, epoxy resin. The underfill material layer 640 may be between the bottom of the first molding layer 190 and the package substrate 600. The underfill material layer 640 may be between a bottom surface of the second molding layer 630 and the package substrate 600. In some embodiments, the underfill material layer 640 may be part of the second molding layer 630 formed by, for example, a molded underfill (MU) method.

FIGS. 10A to 10I are cross-sectional views illustrating a method of manufacturing a semiconductor package according to some embodiments of the present inventive concepts. FIGS. 10A to 10I illustrates a method of manufacturing the semiconductor package 1 of FIG. 1.

Figure 10A:
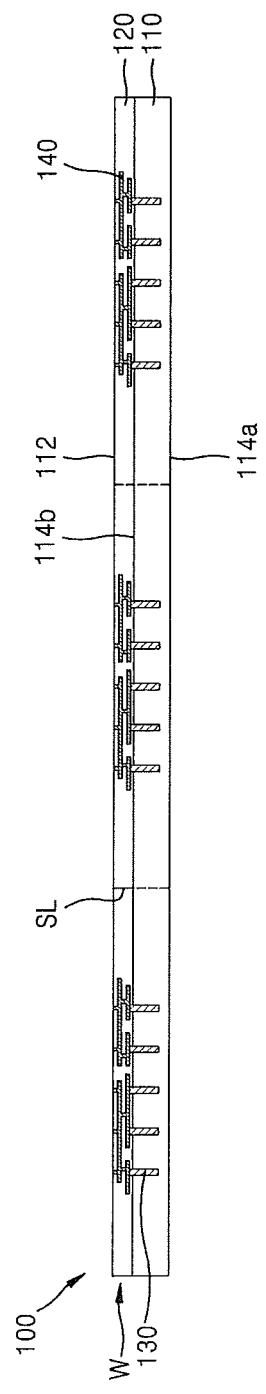
FIGS. 10A to 10I are cross-sectional views illustrating a method of manufacturing a semiconductor package, according to some embodiments of the present inventive concepts.

Referring to FIG. 10A, a semiconductor wafer W is prepared. The semiconductor wafer W may include the first semiconductor chips 100 divided by a scribe lane SL. The first semiconductor chip 100 includes the first semiconductor substrate 110, the first semiconductor device layer 120, and the first through silicon vias 130. The first semiconductor substrate 110 may have a lower surface 114b and an upper surface 114a which are opposite each other. The first semiconductor device layer 120 may have a lower surface 112. The first semiconductor device layer 120 may be formed on the lower surface 114b of the first semiconductor substrate 110. The lower surface 112 of the first semiconductor device layer 120 may be opposite the lower surface 114b of the first semiconductor substrate 110. The first through silicon vias 130 may penetrate at least a portion of the first semiconductor substrate 110 and may be connected to the wire structures 140 within the first semiconductor device layer 120. That is, the first through silicon vias 130 may extend from the lower surface 112 of the first semiconductor device layer 120 in a substantially vertical direction toward the upper surface 114a of the first semiconductor substrate 110 and may not extend to the upper surface 114a of the first semiconductor substrate 110.

Figure 10B:
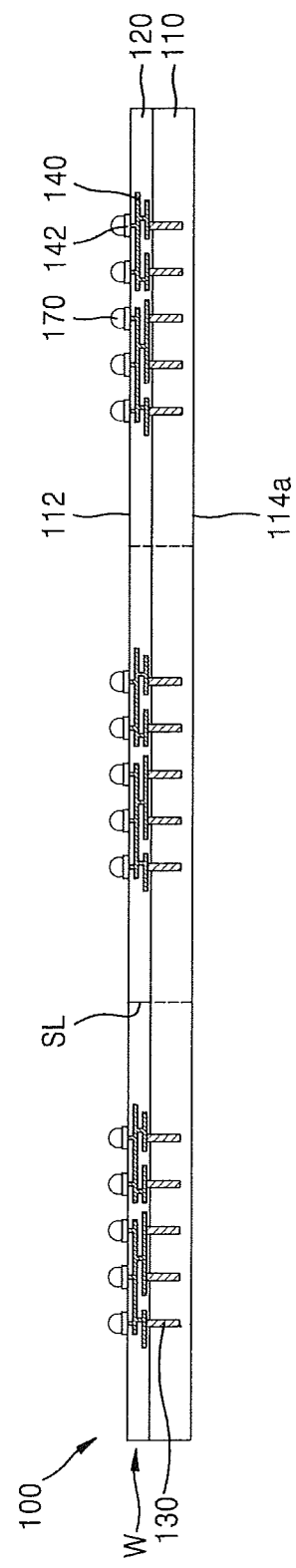

Referring to FIG. 10B, the first lower connection pad 142 and the first connection bump 170 which are electrically connected to the first through silicon via 130 are formed on the lower surface 112 of the first semiconductor device layer 120.

The first lower connection pad 142 may be formed by depositing a metallic layer on the lower surface 112 of the first semiconductor device layer 120 and then patterning the metallic layer.

In order to form the first connection bump 170, a mask pattern (not shown) having an opening that exposes a portion of the first lower connection pad 142 may be formed on the lower surface 112 of the first semiconductor device layer 120, and, then, a conductive material forming the first connection bump 170 may be formed on the first lower connection pad 142 which is exposed by the opening in the mask pattern. For example, the conductive material forming the first connection bump 170 may include a pillar structure and a solder layer which are sequentially formed by an electroplating process.

Then, the mask pattern is removed, and the first connection bump 170 that is convex may be formed by a reflow process.

Figure 10C:
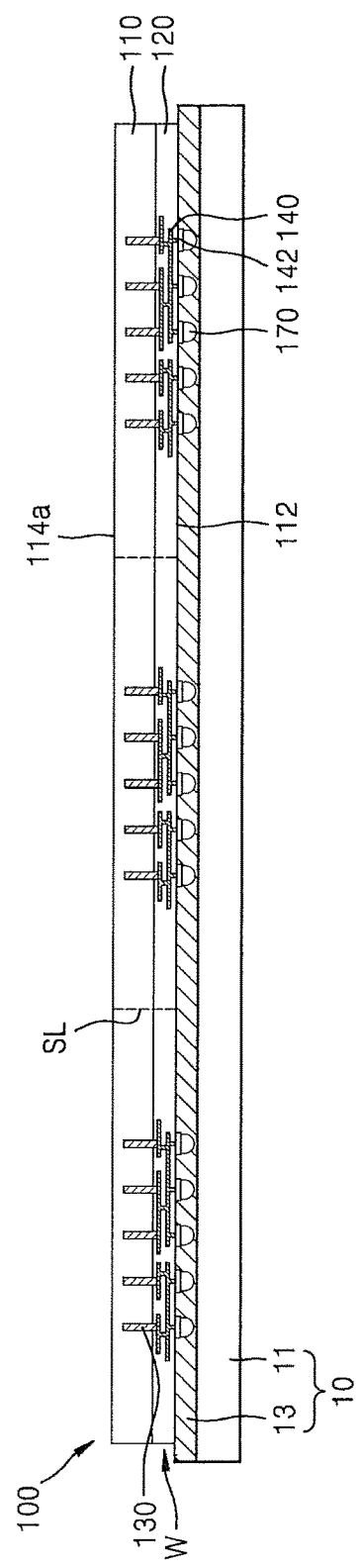

Referring to FIG. 10C, the semiconductor wafer W on which the first connection bumps 170 are formed is attached to a carrier substrate 10. The carrier substrate 10 may include a support substrate 11 and an adhesive material layer 13. The semiconductor wafer W may be attached to the carrier substrate 10 in such a manner that the first connection bumps 170 face the carrier substrate 10. The first connection bumps 170 and the first lower connection pads 142 may be covered by the adhesive material layer 13. A portion of the lower surface 112 of the first semiconductor device layer 120, on which the first connection bumps 170 and the first lower connection pads 142 are not formed, may contact the adhesive material layer 13. The adhesive material layer 13 is formed between the first semiconductor device layer 120 and the support substrate 11.

Figure 10D:
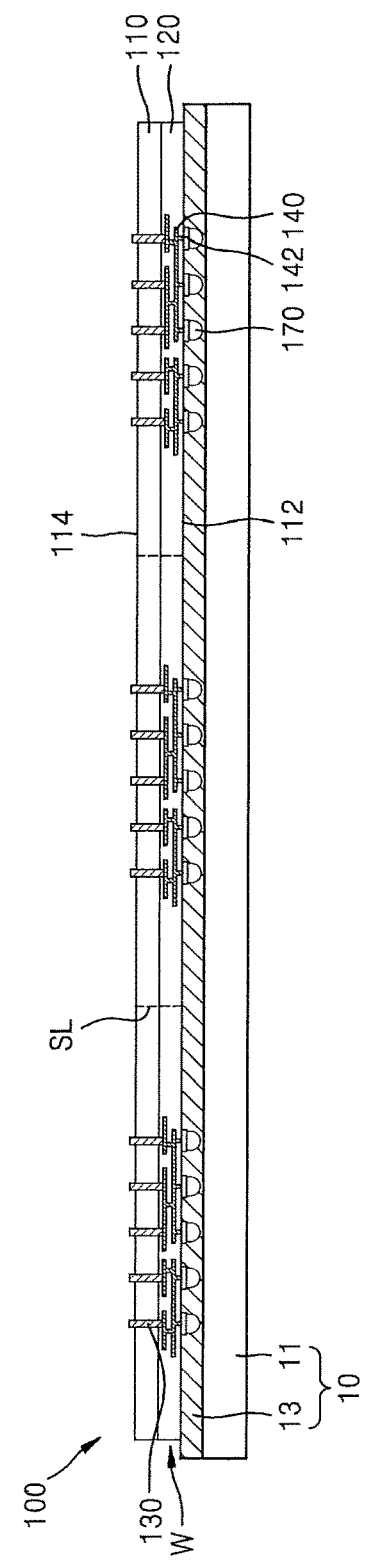

Referring to FIG. 10D, the first through silicon vias 130 are exposed by removing a portion of the semiconductor wafer W. That is, since the portion of the semiconductor wafer W is removed, at least a portion of the first through silicon via 130 may protrude from an exposed surface of the semiconductor wafer W, that is, the portion of the first through silicon via 130 may protrude from the upper surface 114 of the first semiconductor substrate 110.

For example, a Chemical Mechanical Polishing (CMP) process, an etch-back process, or a combination thereof may be used to expose the first through silicon via 130 by removing the portion of the semiconductor wafer W.

Figure 10E:
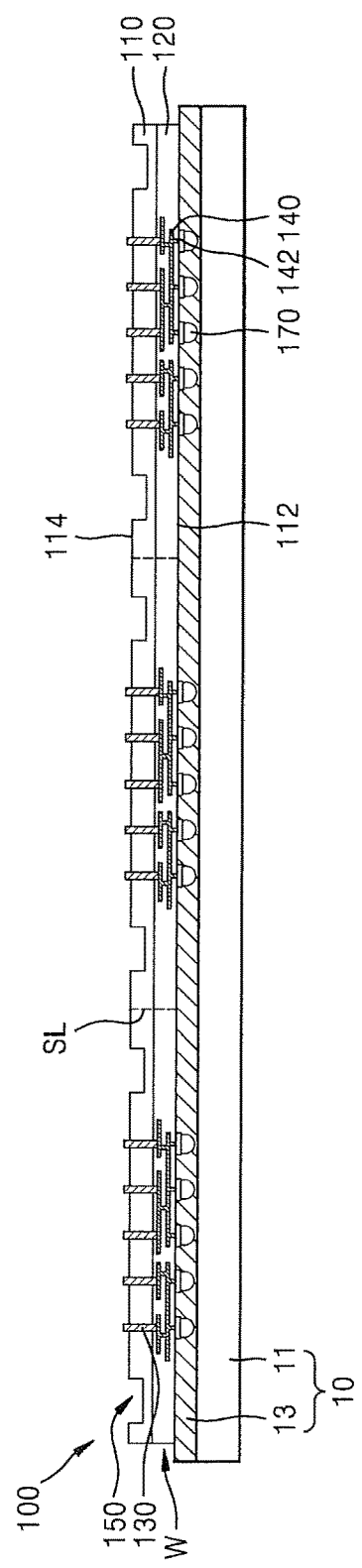

Referring to FIG. 10E, the first trench portions 150 are formed by removing portions of an upper portion of the semiconductor wafer W. The first trench portion 150 may be spaced apart from the first through silicon vias 130 or may be adjacent to the scribe line SL.

For example, a laser drilling process, a patterning process, a sawing process using sawing blades, or a combination thereof may be used to form the first trench portion 150 by removing the portion of the semiconductor wafer W. However, the present inventive concepts are not limited thereto.

A first rear-surface protection layer 160 may be formed over the upper surface of the first semiconductor substrate 110 and surround portions of side surfaces of the first through silicon vias 130.

Figure 10F:
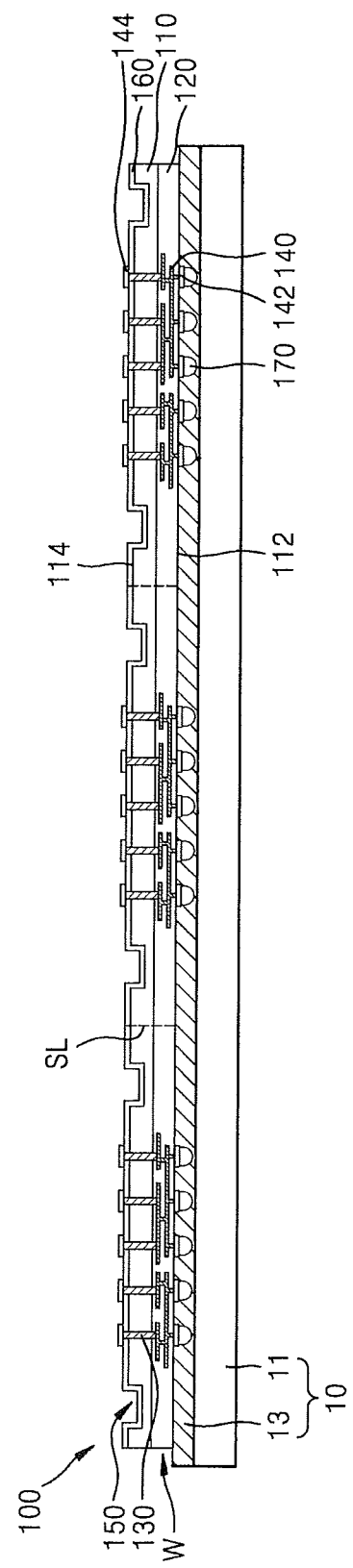

Referring to FIG. 10F, after the first rear-surface protection layer 160 covering the exposed surface of the semiconductor wafer W, that is, the upper surface 114 of the first semiconductor substrate 110 and surrounding the exposed side surfaces of the first through silicon vias 130, is formed, the first upper connection pad 144 electrically connected to the first through silicon via 130 is formed on the first rear-surface protection layer 160. That is, the first rear-surface protection layer 160 may surround side surfaces of the first through silicon vias 130 while exposing an upper surface thereof and the first upper connection pads 144 are formed on the exposed upper surfaces of the first through silicon vias 130 and on portions of the first rear-surface protection layer 160.

The first rear-surface protection layer 160 may cover an upper surface of the first trench portion 150 and may expose the first through silicon via 130. The first rear-surface protection layer 160 may include, for example, an insulating polymer.

Figure 10G:
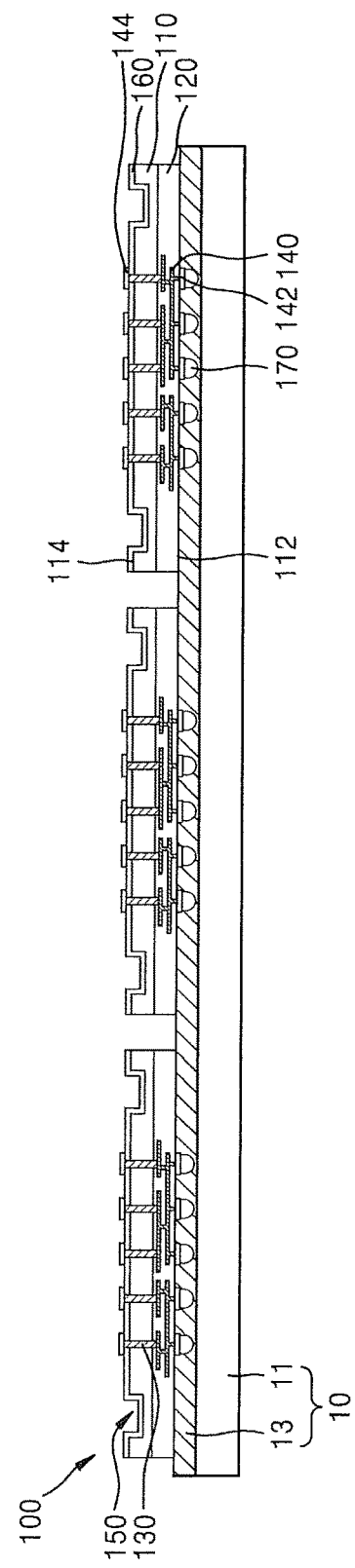

Referring to FIG. 10G, the semiconductor wafer (W of FIG. 10F) is cut along the scribe line (SL of FIG. 10F) and, thus, is separated into the first semiconductor chips 100. The first semiconductor chips 100 may be arranged side by side in a horizontal direction.

Figure 10H:
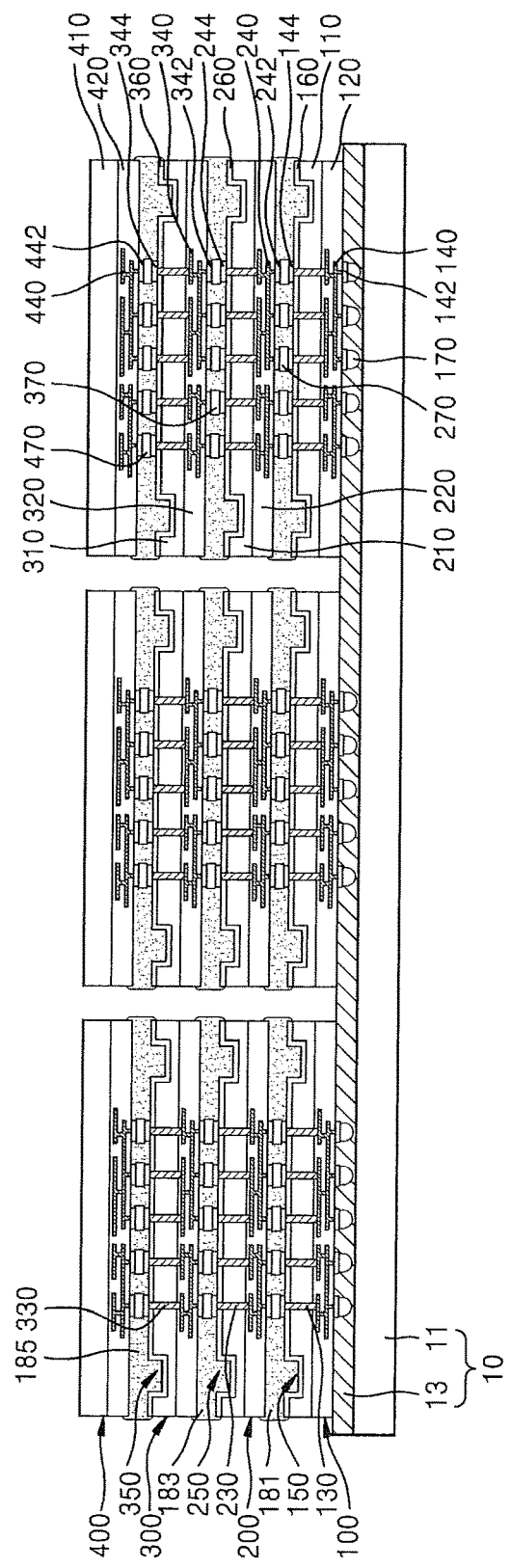

Referring to FIG. 10H, the second semiconductor chips 200, the third semiconductor chips 300, and the fourth semiconductor chips 400 are sequentially stacked in a substantially vertical direction on the first semiconductor chips 100.

In more detail, the second semiconductor chips 200, the third semiconductor chips 300, and the fourth semiconductor chips 400 are prepared prior to being sequentially stacked on the first semiconductor chip 100. The second semiconductor chips 200, the third semiconductor chips 300, and the fourth semiconductor chips 400 are manufactured by a method that is similar to the method described in connection with the first semiconductor chip 100 with reference to FIGS. 10A to 10G and then separated from carrier substrates.

The first semiconductor chips 100, the second semiconductor chips 200, the third semiconductor chips 300, and the fourth semiconductor chips 400 may be of the same type including individual devices. Alternatively, at least one of the first semiconductor chips 100, the second semiconductor chips 200, the third semiconductor chips 300, and the fourth semiconductor chips 400 may be of a different type including different individual devices.

Then, the second semiconductor chips 200 are respectively stacked at locations corresponding to the first semiconductor chips 100. In such an embodiment, the first insulating bonding layers 181 are between the first semiconductor chips 100 and the second semiconductor chips 200, the second connection bumps 270 may be connected to the first upper connection pads 144 and the second lower connection pads 242 and the first insulating bonding layers may surround the first upper connection pads 144, the second connection bumps 270 and the second lower connection pads 242.

The first insulating bonding layers 181 may be formed, for example, on the lower surfaces of the second semiconductor chips 200 before the second semiconductor chips 200 are stacked on the first semiconductor chips 100. Alternatively, the first insulating bonding layers 181 may be formed on the upper surfaces of the first semiconductor chips 100 before the second semiconductor chips 200 are stacked on the first semiconductor chips 100.

A certain amount of heat and pressure is applied to the first insulating bonding layers 181 and the second connection bumps 270 which are between the first semiconductor chips 100 and the second semiconductor chips 200. Accordingly, the first insulating bonding layers 181 are hardened, and, thus, the second semiconductor chips 200 are firmly fixed to the first semiconductor chips 100. The second connection bump 270 are hardened, and, thus, contact resistance between the second connection bumps 270 and the first upper connection pads 144 may decrease.

In some embodiments, the first insulating bonding layers 181 fill the first trench portions 150. Accordingly, while a certain amount of heat and pressure is being applied to the first insulating bonding layers 181, portions of the first insulating bonding layers 181 may protrude in a direction around the first semiconductor chips 100 and the second semiconductor chips 200, but may not excessively cover the side surfaces of the first semiconductor chip 100 and the second semiconductor chip 200.

In particular, when the first trench portions 150 are arranged near regions where the first insulating bonding layers 181 may easily and excessively overflow, regions, where the first insulating bonding layers 181 are easy not to be filled, for example, the regions close to the corners of the first semiconductor chip 100, are fully filled, and excessive overflow of the first insulating bonding layer 181 in a certain region may be prevented at the same time.

Through a process that is substantially the same as a process of stacking the second semiconductor chips 200 on the first semiconductor chips 100, the third semiconductor chips 300 and the fourth semiconductor chips 400 are sequentially stacked on the second semiconductor chips 200 and the third semiconductor chips, respectively.

Figure 10I:
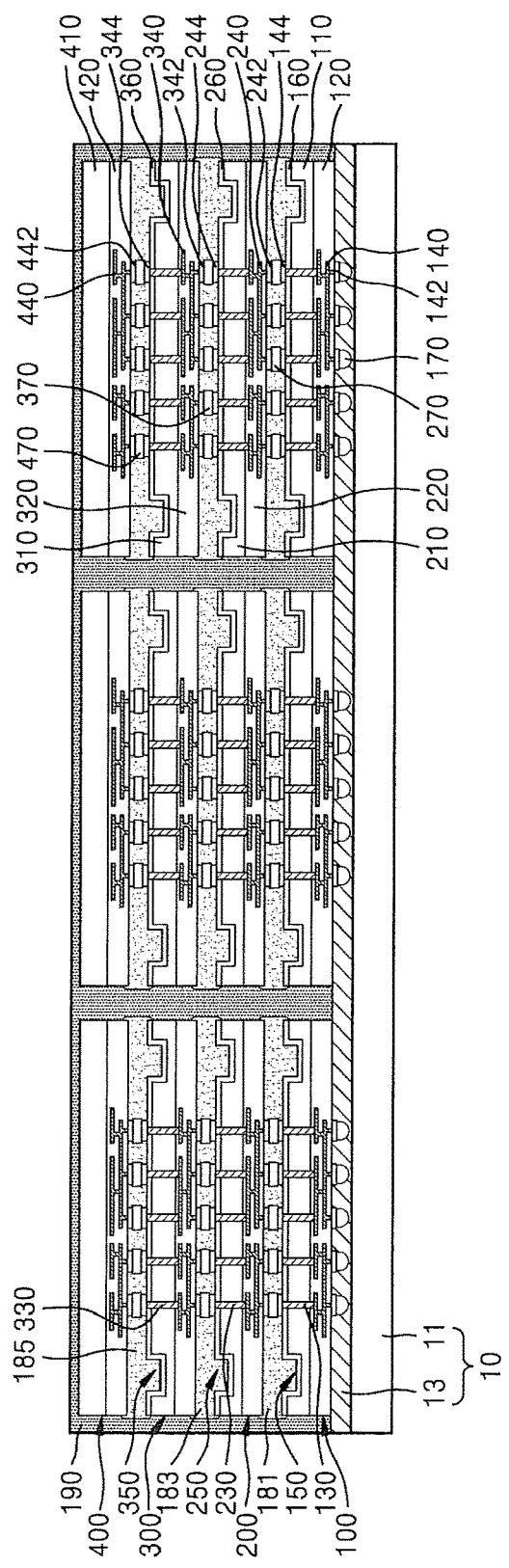

Referring to FIG. 10I, a molding layer 190 covering the first to fourth semiconductor chips 100 to 400 is formed. The molding layer 190 may cover the side surfaces of the first to fourth semiconductor chips 100 to 400 and/or the upper surfaces of the fourth semiconductor chips 400. Also, the molding layer 190 may surround side surfaces of the first, second, and third insulating bonding layers 181, 183, and 185. In some embodiments, the molding layer 190 may include, for example, an EMC.

For example, a sawing process may be performed on the semiconductor package shown in FIG. 10I, and accordingly, the semiconductor packages 1 including the first to fourth semiconductor chips 100 to 400 of FIG. 1 may be separated from each other.

The method of manufacturing the semiconductor package has been described with reference to FIGS. 10A to 10I, but various modifications or adaptations may be made on the method such that semiconductor packages having diverse structures may be manufactured.

Figure 11:
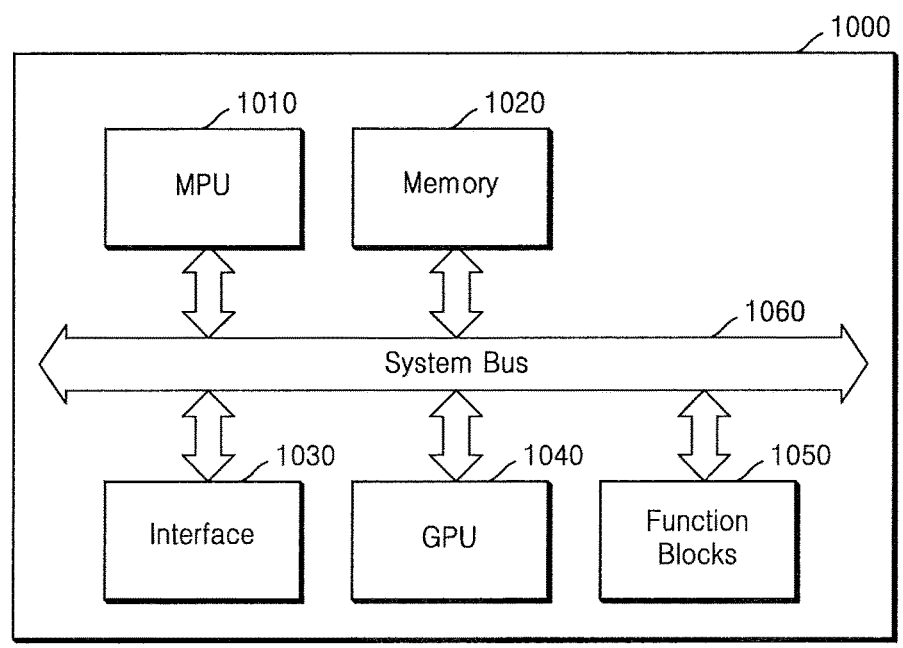
FIG. 11 is a schematic diagram of a structure of a semiconductor package according to some embodiments of the present inventive concepts.

FIG. 11 is a schematic diagram of a structure of a semiconductor package 1000 according to some embodiments of the present inventive concepts.

Referring to FIG. 11, the semiconductor package 1000 may include, for example, a micro processing unit (MPU) 1010, a memory 1020, an interface 1030, a graphic processing unit (GPU) 1040, function blocks 1050, and a system bus 1060 which connects the MPU 1010, the memory 1020, the interface 1030, the GPU 1040, and the function blocks 1050 to each other. The semiconductor package 1000 may include both the MPU 1010 and the GPU 1040 or may include either the MPU 1010 or the GPU.

The MPU 1010 may include a core and L2 cache. For example, the MPU 1010 may include a multi-core. Performance of independent cores of the multi-core of the MPU 1010 may be the same or may differ. Also, the independent cores of the multi-core of the MPU 1010 may have the same activation point in time or different activation points in time.

The memory 1020, for example, may store process results obtained by the function blocks 1050 under the control of the MPU 1010, or the like. The interface 1030, for example, may perform an interface in communication with external devices. The GPU 1040, for example, may perform graphic functions. For example, the GPU 1040 may execute video codecs or process 3-dimensional (3D) graphics. The function blocks 1050 may perform various functions. For example, when the semiconductor package 1000 is an application processor (AP) used in a mobile device, some of the function blocks 1050 may perform a communication function.

The semiconductor package 1000 may include at least one of the semiconductor packages 1, 1*a*, 1*b*, 1*c*, and 2 described in connection with FIGS. 1 to 9.

Although a few embodiments of the present general inventive concepts have been shown and described, it will be appreciated by those skilled in the art that changes may be made in these embodiments without departing from the principles and spirit of the general inventive concepts, the scope of which is defined in the appended claims and their equivalents.

What is claimed is:

1. A semiconductor package comprising:
    a first semiconductor chip comprising:
        a first semiconductor substrate having a lower surface and an upper surface which are opposite each other;
        a first semiconductor device layer disposed on the lower surface of the first semiconductor substrate; and
        a first through silicon via penetrating the first semiconductor substrate and the first semiconductor device layer;
    a second semiconductor chip stacked on the first semiconductor chip and being electrically connected to the first semiconductor chip through the first through silicon via of the first semiconductor chip; and
    an insulating bonding layer between the first semiconductor chip and the second semiconductor chip,
    wherein the first semiconductor chip further includes a trench portion formed on the upper surface of the first semiconductor substrate, and the trench portion is filled with the insulating bonding layer.

2. The semiconductor package of claim 1, wherein the trench portion is spaced apart from an edge of the first semiconductor chip.

3. The semiconductor package of claim 1, wherein the trench portion extends along at least a portion of an edge of the first semiconductor chip.

4. The semiconductor package of claim 3, wherein the trench portion is ring shaped and continuously extends along the edge of the first semiconductor chip.

5. The semiconductor package of claim 3, wherein the trench portion comprises a plurality of squares disposed along the edge of the first semiconductor chip.

6. The semiconductor package of claim 3, wherein the first semiconductor chip further comprises a pad region which includes a plurality of pads, and the pad region is surrounded by the trench portion.

7. The semiconductor package of claim 1, wherein the trench portion comprises a linear shaped trench portion and a bent trench portion which are separated each other, the linear shaped trench portion extends along at least a portion of an edge of the first semiconductor chip, and the bent trench portion extends around at least a portion of a corner of the first semiconductor.

8. The semiconductor package of claim 7, wherein the linear shaped trench portion and the bent trench portion have a first width and a second width respectively, and the first width is greater than the second width.

9. The semiconductor package of claim 1, wherein the second semiconductor chip includes a second trench portion in an upper portion of the second semiconductor chip, and the second trench portion is filled with the insulating bonding layer.

10. The semiconductor package of claim 9, wherein the second semiconductor chip further includes a third trench portion in an lower portion of the second semiconductor chip, and the third trench portion is filled with the insulating bonding layer.

11. The semiconductor package of claim 1, wherein a molding layer is formed along side surfaces of the first semiconductor chip, the second semiconductor chip, and the insulating bonding layer.

12. A semiconductor package comprising:
    first to third semiconductor chips stacked in a vertical direction, and each of the first to third semiconductor chips comprising:
        a semiconductor substrate having a lower surface and an upper surface which are opposite each other
        a semiconductor device layer disposed on the lower surface of the substrate; and
        a through silicon via penetrating the semiconductor substrate and the semiconductor device layer;
    a fourth semiconductor chip stacked on the third semiconductor chip; and
    an insulating bonding layer disposed between the first to fourth semiconductor chips,
    wherein each of the first to third semiconductor chip further includes a trench portion formed on the upper surface of the semiconductor substrate, and the trench portion is filled with the insulating bonding layer.

13. The semiconductor package of claim 12, wherein each trench portion of the first to third semiconductor chips is spaced apart from an edge of the corresponding semiconductor chip.

14. The semiconductor package of claim 12, wherein each trench portion of the first to third semiconductor chips extends along at least a portion of an edge of the corresponding semiconductor chip.

15. The semiconductor package of claim 14, wherein each of the first to third semiconductor chips further comprises a pad region which includes a plurality of pads, and the pad region is surrounded by the trench portion.

16. The semiconductor package of claim 12, wherein the trench portion comprises a linear shaped trench portion and a bent trench portion which are separated each other, the linear shaped trench portion extends along at least a portion of an edge of the first semiconductor chip, and the bent trench portion extends around at least a portion of a corner of the first semiconductor.

17. The semiconductor package of claim 16, wherein the linear shaped trench portion and the bent trench portion have a first width and a second width respectively, and the first width is greater than the second width.

18. The semiconductor package of claim 12, wherein the fourth semiconductor chip includes a second trench portion in an upper portion of the fourth semiconductor chip, and the second trench portion is filled with a molding layer.

19. The semiconductor package of claim 12, wherein the fourth semiconductor chip includes a second trench portion in an upper portion of the fourth semiconductor chip, and the second trench portion is filled with a thermal interface layer.

20. The semiconductor package of claim 19, wherein a molding layer is formed along side surfaces of the first to fourth semiconductor chips, the insulating bonding layer and on the upper portion of the fourth semiconductor chip.

\* \* \* \* \*